(12) United States Patent
Kato et al.

(10) Patent No.: US 11,075,144 B2
(45) Date of Patent: Jul. 27, 2021

(54) COOLER AND SEMICONDUCTOR MODULE (71) Applicants: FUJI ELECTRIC CO., LTD., Kawasaki (JP); WASEDA UNIVERSITY, Tokyo (JP)

(72) Inventors: Ryoichi Kato, Kanagawa (JP); Hiromichi Gohara, Kanagawa (JP); Yoshinari Ikeda, Kanagawa (JP); Tomoyuki Miyashita, Tokyo (JP); Yoshihiro Tateishi, Tokyo (JP); Shunsuke Numata, Tokyo (JP)

(73) Assignees: FUJI ELECTRIC CO., LTD., Kawasaki (JP); WASEDA UNIVERSITY, Tokyo (JP)

( * ) Notice: Subject to any disclaimer, the term of this patent is extended or adjusted under 35 U.S.C. 154(b) by 0 days.

(21) Appl. No.: 16/944,345

(22) Filed: Jul. 31, 2020

(65) Prior Publication Data
US 2020/0365487 A1 Nov. 19, 2020

Related U.S. Application Data (63) Continuation of application No. PCT/JP2019/029428, filed on Jul. 26, 2019.

(30) Foreign Application Priority Data

Aug. 9, 2018 (JP) .............................. JP2018-150206

(51) Int. Cl.
*H01L 23/473* (2006.01)
*H01L 23/498* (2006.01)

(52) U.S. Cl.
CPC ...... *H01L 23/473* (2013.01); *H01L 23/49822* (2013.01)

(58) Field of Classification Search
CPC . H01L 23/473; H01L 23/49822; H01L 25/07; H01L 21/4882; H01L 23/24;
(Continued)

(56) References Cited

U.S. PATENT DOCUMENTS

2009/0071625 A1* 3/2009 Lyon ..................... H01L 23/473
165/104.19
2010/0170662 A1* 7/2010 Baba ..................... H01L 25/072
165/104.33

(Continued)

FOREIGN PATENT DOCUMENTS

CN 107078115 A 8/2017
DE 102016124103 A1 6/2017
(Continued)

OTHER PUBLICATIONS

PCT/ISA/210, "International Search Report for International Application No. PCT/JP2019/029428," dated Oct. 8, 2019.
(Continued)

*Primary Examiner* — Alexander O Williams
(74) *Attorney, Agent, or Firm* — Manabu Kanesaka (57) ABSTRACT

Provided is a cooler having high cooling efficiency and low pressure loss of fluid. A cooler includes: a flow-channel part at least including a plate-like fin (top plate) and a plate-like fin (bottom plate); and a continuous groove-like flow channel defined between the top plate and the bottom plate to flow fluid, the cooler being configured to cool semiconductor elements. When the flow-channel part is viewed from the direction parallel to the top plate and intersecting the flow channel, the flow channel has a corrugated shape so that a face of the flow channel closer to the top plate and a face of the flow channel closer to the bottom plate bend in a synchronized manner toward the top plate and the bottom plate.

11 Claims, 7 Drawing Sheets

(58) Field of Classification Search
CPC ............... H01L 25/18; H01L 23/3735; H01L 2224/32225; H01L 23/498; H05K 7/20
USPC .......................................................... 257/714
See application file for complete search history.

(56) References Cited

U.S. PATENT DOCUMENTS

| | | | |
|---|---|---|---|
| 2010/0252235 A1* | 10/2010 | Mori ................. | H05K 7/20927 165/104.19 |
| 2011/0094722 A1* | 4/2011 | Mori .................... | H01L 23/473 165/181 |
| 2011/0127205 A1* | 6/2011 | Schlederer ......... | B01D 21/0063 210/209 |
| 2012/0152498 A1* | 6/2012 | Lyon .................... | H01L 23/473 165/104.31 |
| 2014/0345577 A1* | 11/2014 | Meshenky ............ | F28D 9/0056 123/542 |
| 2015/0189791 A1* | 7/2015 | Tamura ..................... | F28D 1/04 165/148 |
| 2016/0238325 A1* | 8/2016 | Johnson ................. | F25B 39/00 |
| 2016/0315365 A1* | 10/2016 | Vanderwees ...... | H01M 10/6557 |
| 2016/0348987 A1* | 12/2016 | Minami ............... | B23K 1/0012 |
| 2017/0122679 A1* | 5/2017 | Kenney ..................... | F28F 3/08 |
| 2017/0207145 A1 | 7/2017 | Yamada et al. | |
| 2018/0156169 A1* | 6/2018 | Hoepfner ............. | B21D 53/022 |
| 2019/0203368 A1* | 7/2019 | Cam .......... | C22B 1/00 |
| 2019/0335610 A1 | 10/2019 | Oguri | |
| 2019/0353425 A1* | 11/2019 | Streng .................. | F28F 25/087 |
| 2020/0006822 A1* | 1/2020 | Shisler .................... | F28D 9/005 |
| 2020/0217596 A1* | 7/2020 | Civeira Dominguez . | F28F 1/40 |
| 2020/0258815 A1* | 8/2020 | Suzuki ..................... | F28F 13/06 |
| 2020/0271392 A1* | 8/2020 | Rajani ....................... | F28F 9/04 |
| 2020/0373222 A1* | 11/2020 | Iyengar ................ | H01L 23/473 |

FOREIGN PATENT DOCUMENTS

| | | |
|---|---|---|
| EP | 3309827 A1 | 4/2018 |
| JP | 2006-100293 A | 4/2006 |
| JP | 2008-235572 A | 10/2008 |
| JP | 2010-114174 A | 5/2010 |
| JP | 2011-159663 A | 8/2011 |
| JP | 2013-165298 A | 8/2013 |
| JP | 2013-235967 A | 11/2013 |
| JP | 2014-033063 A | 2/2014 |
| JP | 2017-005171 A | 1/2017 |
| JP | 2017-108045 A | 6/2017 |
| JP | 2018-113409 A | 7/2018 |
| WO | 2016/158020 A1 | 10/2016 |

OTHER PUBLICATIONS

PCT/ISA/237, "Written Opinion of the International Searching Authority for International Application No. PCT/JP2019/029428," dated Oct. 8, 2019.

Japan Patent Office, "Office Action for Japanese Patent Application No. 2020-536471," dated Dec. 8, 2020.

\* cited by examiner

| AMPLITUDE $x_1$ [mm] | FLOW-CHANNEL INTERVAL $x_2$ [mm] | FLOW-CHANNEL WIDTH $x_3, z_3$ [mm] | INTERVAL $y_1, y_2$ [mm] | AMPLITUDE $z_1$ [mm] |
|---|---|---|---|---|
| 1.50 | 2.50 | 0.90 | 4.50 | 0.45 |

| | AMPLITUDE $x_1$[mm] | FLOW-CHANNEL INTERVAL $x_2$[mm] | FLOW-CHANNEL INTERVAL $z_2$[mm] | FLOW-CHANNEL WIDTH $x_3, z_3$[mm] | INTERVAL $y_1, y_2$[mm] | AMPLITUDE $z_1$[mm] | PHASE DIFFERENCE $\phi$[deg] | TEMPERATURE T [°C] |
|---|---|---|---|---|---|---|---|---|
| EXAMPLE 1 | 1.50 | 2.00 | 0.30 | 0.90 | 3.00 | 0.30 | 0.0 | 66.65 |
| COMPARATIVE EXAMPLE 1 | 1.50 | 2.00 | 0.30 | 0.90 | 3.00 | 0.00 | NONE | 69.75 |
| EXAMPLE 2 | 1.50 | 3.00 | 0.30 | 0.90 | 3.00 | 0.30 | 0.0 | 66.36 |
| COMPARATIVE EXAMPLE 2 | 1.50 | 3.00 | 0.30 | 0.90 | 3.00 | 0.00 | NONE | 69.98 |
| EXAMPLE 3 | 1.50 | 2.00 | 0.30 | 0.90 | 7.00 | 0.90 | 0.0 | 66.95 |
| COMPARATIVE EXAMPLE 3 | 1.50 | 2.00 | 0.30 | 0.90 | 7.00 | 0.90 | NONE | 70.29 |

COOLER AND SEMICONDUCTOR MODULE

CROSS-REFERENCE TO RELATED APPLICATION

This is a continuation application of PCT International Application No. PCT/JP2019/029428 filed on Jul. 26, 2019, which claims a priority of Japanese Patent Application No. 2018-150206 filed on Aug. 9, 2018, the disclosure of which is incorporated herein.

TECHNICAL FIELD

The present invention relates to coolers to cool a semiconductor element with fluid, and a semiconductor module including the cooler.

BACKGROUND ART

To suppress adverse effects from heat generated from a circuit, conventional power semiconductor modules operating as a switching device for power conversion or the like include cooling fins as a heat dissipation member. The following liquid-cooling type cooler has been known, for example.

In the left fin as one of the two adjacent fins, two inclined parts connect two adjacent crests and the trough located between the two crests. One of the faces of the two inclined parts (right faces directed to the right fin) and the horizontal plane form two lines of the intersection, and these two lines intersect at point P1. In the fin, a first straight line L1 extending in the front-rear direction joins these points P1. In the right fin, two inclined parts connect two adjacent troughs and the crest located between the two troughs. The left side faces of the two inclined parts directed to the left fin and the horizontal plane form two lines of the intersection, and these two lines intersect at point P2. In the fin, a second straight line L2 extending in the front-rear direction joins these points P2. The first straight line L1 is located on the right of the second straight line L2, and the points P1 and the points P2 are located closer to the fin on the other side than one straight line extending in the front-rear direction (flowing direction of the coolant) on the horizontal plane. With this configuration, coolant flows while meandering through the flow-channel part between the adjacent two fins in the flow channel (see Japanese Patent Application Laid-Open No. 2013-165298).

SUMMARY OF INVENTION

Technical Problem

The fin structure described in the document as stated above keeps the coolant in contact with the heating element for a longer time than conventional straight fins, and so has better radiation performance. Ideally the fin structure has to have both of good radiation performance and low pressure loss of the coolant, and so the improvement is still required.

In view of the above problem, the present invention provides a cooler having further higher cooling efficiency and low pressure loss.

Solution to Problem

To achieve this, a cooler according to the first aspect of the present invention includes: a flow-channel part at least including a top plate and a bottom plate; and a continuous groove-like flow channel defined between the top plate and the bottom plate to flow fluid, the cooler being configured to cool a semiconductor element. When the flow-channel is viewed from a direction parallel to the top plate and intersecting the flow channel, the flow channel has a corrugated shape so that a face of the flow channel closer to the top plate and a face of the flow channel closer to the bottom plate bend in a synchronized manner toward the top plate and the bottom plate.

The cooler of this aspect includes the flow-channel part at least including the top plate and the bottom plate, and is configured to cool a semiconductor element with fluid (e.g., water) flowing through the flow channel between the top plate and the bottom plate. When the flow-channel part is viewed from the direction parallel to the top plate and intersecting the flow channel, the flow channel has a corrugated shape so that a face of the flow channel closer to the top plate and a face of the flow channel closer to the bottom plate bend in a synchronized manner toward the top plate and the bottom plate, and this allows fluid to travel while swaying toward the top plate and the bottom plate. This enables a large contact area of fluid with the inner walls of the flow channel and allows the fluid to flow while suppressing pressure loss due to swirling flow, for example. The cooler therefore has high cooling efficiency and low pressure loss.

Preferably in the cooler according to the first aspect, the flow-channel part includes at least one plate-like fin disposed between the top plate and the bottom plate, a plurality of flow channels is partitioned by the plate-like fin and is defined between the top plate and the bottom plate, and when the flow-channels are viewed from the direction parallel to the top plate and intersecting the flow channels, the plurality of flow channels each has a corrugated shape so that a face of the flow channel closer to the top plate and a face of the flow channel closer to the bottom plate bend in a synchronized manner toward the top plate and the bottom plate.

With this configuration, the flow-channel part includes at least one plate-like fin disposed between the top plate and the bottom plate and the plurality of flow channels is partitioned by the at least one plate-like fin and is defined between the top plate and the bottom plate, and these flow channels have a corrugated shape so as to bend in a synchronized manner toward the top plate and the bottom plate. The plurality of flow channels is defined in an overlapping manner between the top plate and the bottom plate, and fluid travels through the plurality of flow channels while swaying toward the top plate and the bottom plate in a synchronized manner. This suppresses the pressure loss and improves the cooling efficiency more.

Preferably in the cooler of the first aspect, when the flow-channel part is viewed from a direction perpendicular to the top plate, the flow channel has a corrugated shape so that both side faces of the flow channel bend in a synchronized manner.

With this configuration, when the flow-channel part is viewed from a direction perpendicular to the top plate, the flow channels of the plate-like fins have a corrugated shape so that both side faces of the flow channel bend in a synchronized manner. Fluid therefore travels while swaying in the horizontal direction along the face of the top plate in addition to the swaying toward the top plate and the bottom plate. This increases a contact area of cooled fluid with the inner walls of the flow channel more and allows the fluid to flow with less swirling flow and without stopping. This configuration therefore improves the cooling efficiency.

Preferably in the cooler according to the first aspect, an interval y between a crest and a trough of the flow channel viewed from the direction perpendicular to the top plate is equal to an interval $y_2$ between a crest and a trough of the flow channel viewed from the direction parallel to the top plate and intersecting the flow channel.

The interval $y_1$ viewed from the direction perpendicular to the top plate is a half wavelength of the waveform viewed from this direction, and the interval $y_2$ viewed from the direction parallel to the top plate and intersecting the flow channel is a half wavelength of the waveform viewed from this direction. The same intervals $y_1$ and $y_2$ facilitate the design of the flow channels because the characteristics of the flow channels, such as pressure loss, can be examined by changing the other parameters.

Preferably in the cooler according to the first aspect, the corrugated shape of the flow channel viewed from the direction perpendicular to the top plate and the corrugated shape of the flow channel viewed from the direction parallel to the top plate and intersecting the flow channel have a phase difference $\phi$ satisfying a relationship of $0°+90°n \leq \phi \leq 30°+90°n$ or $60°+90°n \leq \phi \leq 90°+90°n$ (n=0,1,2, 3).

The temperature and the pressure loss, which determine the performance of a cooler, change with the phase difference $\phi$ of the two corrugated shapes viewed from these directions. The phase difference $\phi$ satisfying the relationship of $90° \leq \phi \leq 120°$ or $150° \leq \phi \leq 180°$ (in the case of n=1) yields appropriate values for both of the cooling efficiency and the pressure loss, and so allows the cooler to exert its function.

Preferably in the cooler according to the first aspect, that $x_1$ denotes amplitude of the flow channel viewed from the direction perpendicular to the top plate and $z_1$ denotes amplitude of the flow channel viewed from the direction parallel to the top plate and intersecting the flow channel, $x_1$ and $z_1$ have a relationship of $z_1 \leq x_1 \leq 3z_1$.

With this configuration, the amplitude $x_1$ of the flow channel viewed from the direction perpendicular to the top plate is allowed to change in the range of 1 to 3 times the amplitude $z_1$ of the flow channel viewed from the direction parallel to the top plate and intersecting the flow channel. In one example, the amplitude $x_1$ may be set relatively large in this range while considering the overall length of the flow channel, and this increases the area of fluid coming in contact with the semiconductor element, and so improves the cooling efficiency.

Preferably in the cooler according to the first aspect, that $x_2$ denotes an interval between the adjacent flow channels and $x_3$ denotes a width of each flow channel viewed from the direction perpendicular to the top plate, $x_2$ and $x_3$ have a relationship of $2x_3 \leq x_2$.

With this configuration, the interval $x_2$ between the adjacent flow channels viewed from the direction perpendicular to the top plate may be set twice or more the width $x_3$ of the flow channel, and this allows the flow channels in a certain number to be placed at the flow-channel part. This also increases the area of fluid coming in contact with the semiconductor element, and so improves the cooling efficiency.

A semiconductor module according to the second aspect of the present invention includes: a semiconductor element; a multilayer board having the semiconductor element mounted thereon, the multilayer board including an insulating substrate and conducting plates sandwiching the insulating substrate from an upper face and a lower face of the insulating substrate; and a cooler bonding with a face of the multilayer board where the semiconductor element is not mounted, the cooler being configured to flow fluid to cool the semiconductor element, the cooler being the cooler according to the first aspect of the present invention as stated above.

The semiconductor module according to the second aspect is configured so that the semiconductor element is mounted on the multilayer board, and the cooler bonds with a face of the multilayer board where the semiconductor element is not mounted. Fluid (e.g., water) flows through this cooler to cool the semiconductor element, and the multilayer board is made of a material having high thermal conductivity. Such a semiconductor module effectively cools the semiconductor element.

When the flow-channel part is viewed from the direction parallel to the top plate and intersecting the flow channel, the flow channel of the flow-channel part of the cooler (the first aspect) has a corrugated shape so that a face of the flow channel closer to the top plate and a face of the flow channel closer to the bottom plate bend in a synchronized manner toward the top plate and the bottom plate, and this allows fluid to travel while swaying toward the top plate and the bottom plate. This enables a large contact area of fluid with the inner walls of the flow channel and allows the fluid to flow while suppressing pressure loss due to swirling flow, for example. This increases the cooling efficiency of the semiconductor element.

DESCRIPTION OF EMBODIMENTS

The following describes a semiconductor module that is one embodiment of the present invention, with reference to the drawings.

Figure 1:
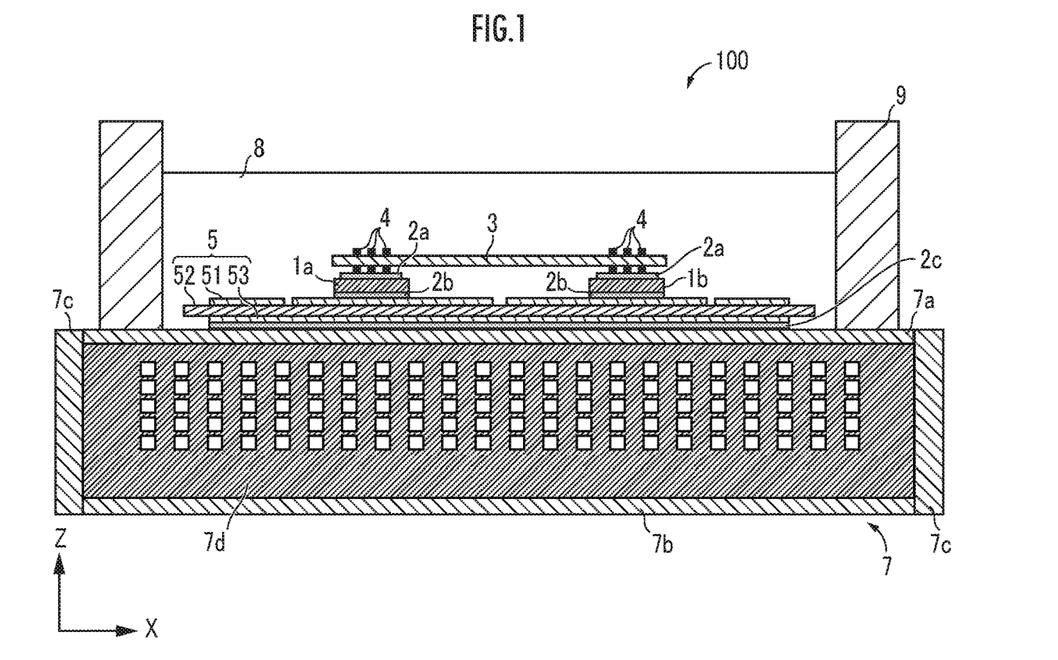
FIG. 1 is a cross-sectional view of a semiconductor module according to one embodiment of the present invention.

FIG. 1 is a cross-sectional view of a semiconductor module 100 according to one embodiment of the present invention. The semiconductor module 100 mainly includes two semiconductor elements 1a and 1b, a wiring board 3, a multilayer board 5, a cooler 7, and a case 9. As shown in the drawing, the semiconductor elements 1a and 1b, the wiring board 3, and the multilayer board 5 are stored in the case 9, and are embedded in resin 8. The cooler 7 to cool the semiconductor elements 1a and 1b is disposed on lower face of the case 9.

In one example, the semiconductor elements 1a and 1b each include an insulated gate bipolar transistor (IGBT) or a metal oxide semiconductor field effect transistor (power-MOSFET). They may be a reverse blocking-IGBT (RB-IGBT) or a reverse conducting-IGBT (RC-IGBT) that includes these transistors disposed longitudinally in one semiconductor element.

The wiring board 3 is disposed close to the upper faces of the semiconductor elements 1a and 1b. The wiring board 3 includes an insulating substrate and metal foil that covers the both faces of the insulating substrate, and the metal foil on the lower face faces the semiconductor elements 1a and 1b. Preferably the insulating substrate is made of a material having a low dielectric constant and high thermal conductivity. Examples of the material include a resin insulating material containing resin, such as epoxy resin, and ceramics, such as $Si_3N_4$, AlN and $Al_2O_3$. For the metal foil, a material having low electric resistance and high thermal conductivity is preferable, and examples of such a material include Cu.

Pins 4 are disposed so that one end of each pin 4 joins to the upper face of the semiconductor element 1a or 1b via metal bonding members 2a and the other end connects to the wiring board 3. The pins 4 may be made of metal having low electric resistance and high thermal conductivity, such as Cu. The metal bonding members 2a may be members including metal particulates, such as solder and silver.

As shown in the drawing, a plurality of pins 4 is preferably disposed for each of the semiconductor elements 1a and 1b. Such a configuration reduces the electric resistance and improves the thermal conductivity.

The multilayer board 5 includes an insulating substrate 52, a first conducting plate 51 disposed on the upper face of the insulating substrate 52, and a second conducting plate 53 disposed on the lower face of the insulating substrate 52. The insulating substrate 52 may be made of a material having excellent electrical insulation property and thermal conductivity. Examples of the material of the insulating substrate 52 include $Al_2O_3$, AlN and $Si_3N_4$. For high-voltage use, the material preferably has both of the electrical insulation property and the thermal conductivity. To this end, AlN and $Si_3N_4$ may be used, and the material is not limited to them.

The first conducting plate 51 and the second conducting plate 53 may be made of a metal material (metal foil), such as Cu and Al, that has excellent electrical conductivity and workability. In the descriptions, the second conducting plate 53 made of Cu may be called rear-face copper foil. For other purposes, such as rust prevention, these conducting plates may be made of Cu or Al with Ni-plating. To place these conducting plates 51 and 53 on the insulating substrate 52, the methods of direct copper bonding and active metal brazing can be used.

The multilayer board 5 is disposed on the lower faces of the semiconductor elements 1a and 1b. The multilayer board 5 includes the metal foil, such as Cu, covering both faces of the insulating substrate 52, and the insulation property of the insulating substrate 52 electrically isolates the metal foil between the both faces. Preferably the outer edge of the insulating substrate 52 sticks out from the outer edges of the conducting plates 51 and 53. The example described here includes the insulating substrate 52 with the second conducting plate 53, such as the rear-face copper foil. In another example, the insulating substrate and the cooler may thermally bond (in such a manner of effectively transmitting heat) via a bonding member having excellent thermal conductivity.

The semiconductor elements are mounted on the multilayer board. Specifically the lower face of each of the semiconductor elements 1a and 1b and the first conducting plate 51 on the upper face of the multilayer board 5 electrically and thermally bond via the metal bonding member 2b. Although the metal foil on the upper face and the lower face of the multilayer board 5 are electrically separated, it has good thermal conductivity between the separated parts. The second conducting plate 53 on the lower face of the multilayer board 5 and an outer wall (top plate 7a) of the cooler 7 bond via a metal bonding member 2c. That is, the semiconductor elements 1a and 1b are disposed above the top plate 7a of the cooler 7. The metal bonding members 2b and 2c may be members including metal particulates, such as solder and silver, having excellent thermal conductivity and electrical conductivity. The multilayer board and the cooler thermally bond via the bonding member having excellent thermal conductivity. To this end, the bonding material may be a metal bonding member having electrical conductivity, or thermal compound mainly containing base oil and ceramic filler. This bonding member has thermal conductivity of 1 W/m·K or higher preferably, and 10 W/m·K or higher more preferably.

The cooler 7 includes the top plate 7a, the bottom plate 7b, a lateral frame 7c and a flow-channel part 7d. Although described later in details, the flow-channel part 7d includes a plurality of plate-like fins stacked in Z-axis direction, for example. The top plate 7a, the bottom plate 7b, and the flow-channel part 7d defining the flow channel are made of metal having high thermal conductivity, such as Al and Cu.

Embodiment 1

Figure 2:
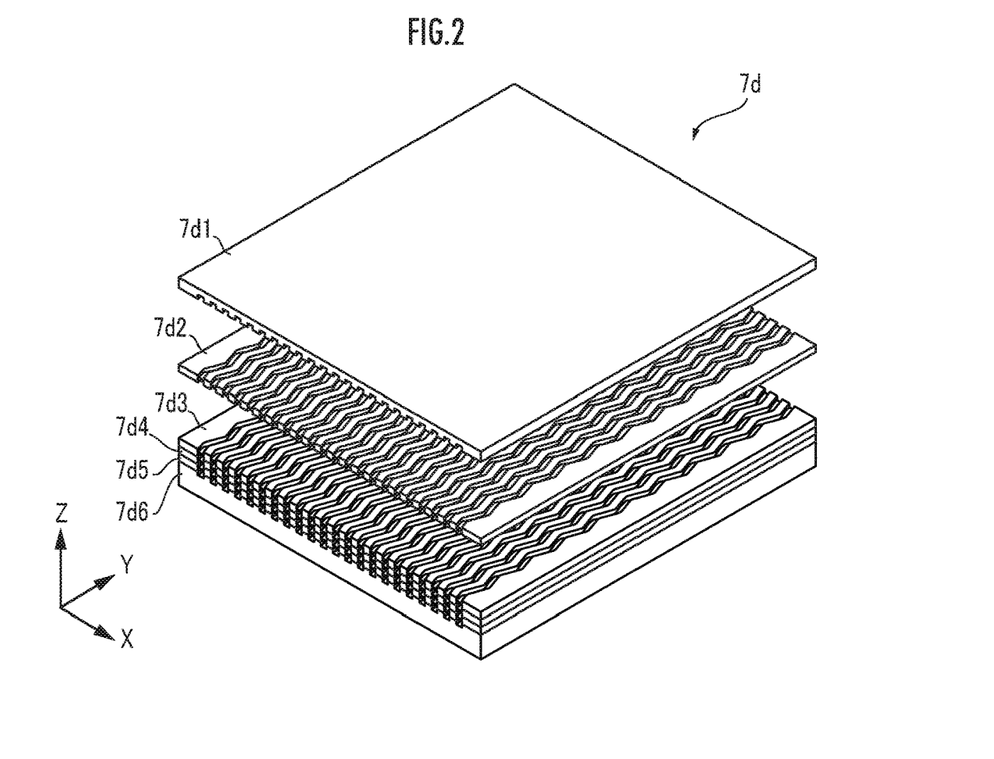
FIG. 2 is a perspective view of a flow-channel part of a cooler.
Figure 3A:
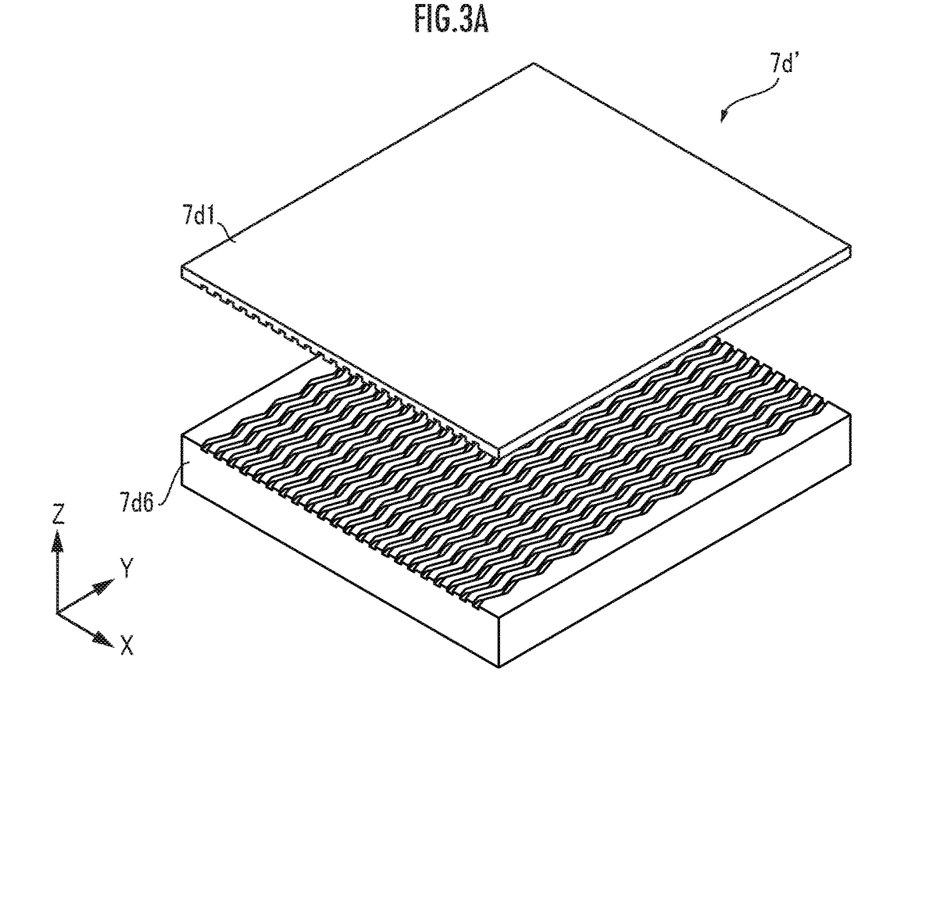
FIG. 3A is a perspective view of a flow-channel part of a cooler (including two plate-like fins).
Figure 3B:
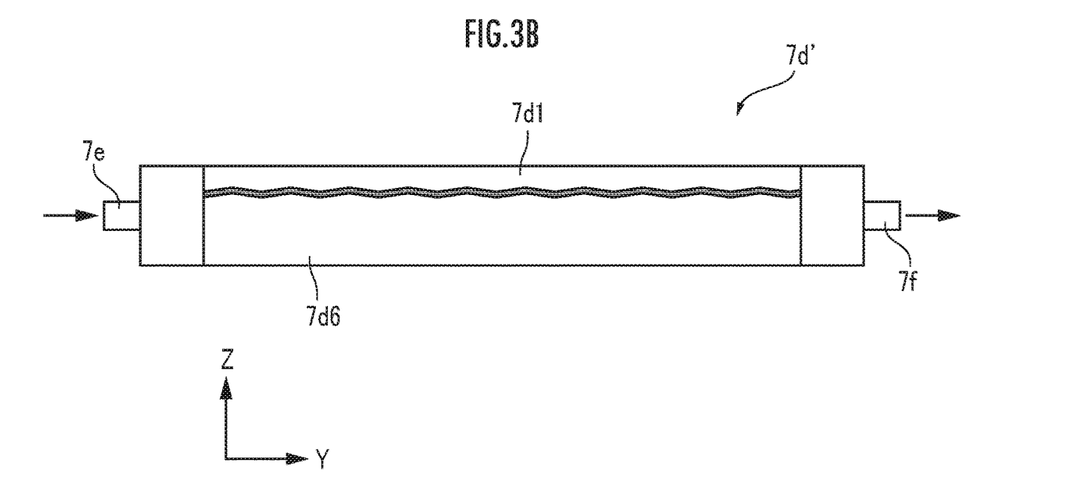
FIG. 3B is a side view of the flow-channel part of the cooler in FIG. 3A.

Next referring to FIG. 2 to FIG. 3B, the following describes the details of a cooler according to Embodiment 1 of the present invention. Shape parameters of the cooler described later were determined by evaluating the temperature and the pressure loss of the cooler while changing the shape parameters and so on of the flow-channel part of the present invention with thereto-fluid analysis software, and then producing a flow-channel part on a trial basis for verification.

FIG. 2 is a partially exploded perspective view of the flow-channel part 7d that is extracted from the cooler 7. As shown in the drawing, the flow-channel part 7d includes sixth plate-like fins 7d1 to 7d6. The plate-like fin 7d1 located uppermost has continuous groove-like flow channels on the lower face only to flow fluid. In this case, the plate-like fin 7d1 located uppermost may double as the top plate. The plate-like fin 7d6 located lowermost has flow channels on the upper face only. In this case, the plate-like fin 7d6 located lowermost may double as the bottom plate.

The number of the plate-like fins is not limited to six, which may be two of the plate-like fin 7d1 (top plate) and the plate-like fin 7d6 (bottom plate). In this case, as shown in FIG. 3A, the flow channel of the flow-channel part 7d' has one layer.

FIG. 3B is a side view of the flow-channel part 7d' shown in FIG. 3A. Fluid flowing into the cooler 7 through an inlet 7e in Y-axis direction travels through the flow channel of the flow-channel part 7d', and flows out through an outlet 7f. As shown in the drawing, the flow channel of the flow-channel part 7d' is one layer defined by the plate-like fin 7d1 and the plate-like fin 7*d*6, and has a corrugated shape that vertically (up-down direction) bends (Z-axis direction).

In the present embodiment, Z-axis direction (vertical direction) in FIG. 2 and FIG. 3A corresponds to the direction perpendicular to the top plate in the present invention. X-axis direction in FIG. 2 and FIG. 3A (the direction of viewing the flow-channel part 7*d'* laterally) corresponds to the direction parallel to the top plate and intersecting the flow channel in the present invention. Y-axis direction in FIG. 2, FIG. 3A and FIG. 3B corresponds to the direction of the flow channel in the present invention.

Referring back to FIG. 2, all of the plate-like fins 7*d*2 through 7*d*5 disposed between the plate-like fins 7*d*1 and 7*d*6 have the identical structure, and each may have flow channels on their both faces. When the plate-like fins adjacent to each other are stacked in Z-axis direction, they define flow channels each having a certain height. Each of these flow channels keeps the certain height and displaces periodically while bending vertically.

The plate-like fins 7*d*2 to 7*d*5 each have a thickness of 3.0 mm, and the flow channel formed on one of the faces has a deep part and a shallow part in Z-axis direction. The flow channels of these plate-like fins 7*d*2 to 7*d*5 are formed at regular intervals in X-axis direction, and a deep part of one flow channel on the surface is opposed to a shallow part of another flow channel on the rear face. When two plate-like fins are stacked in Z-axis direction, they define corrugated-shaped flow channels each having a certain height so that the upper face and the lower face of the flow channel bend vertically in synchronization with each other. In the present embodiment, the upper face corresponds to the face of a flow channel closer to the top plate in the present invention, and the lower face corresponds to the face of the flow channel closer to the bottom plate in the present invention.

With this configuration, fluid passing through the flow channels of the flow-channel part 7*d* (flow-channel part 7*d'*) travels while swaying vertically (Z-axis direction). Such a shape of the flow channels enables the cooled fluid flowing into the flow-channel part 7*d* through the inlet 7*e* to travel through the flow channels while generating exchanging of the fluid vertically and without generating swirling flow or stopping. This effectively brings the cooled fluid into contact with the inner walls of the flow channels of the cooler 7, and so improves the cooling effect through heat exchange. This means that heat generated at the semiconductor elements 1*a* and 1*b* that are placed above the top plate 7*a* of the cooler 7 can be effectively transmitted toward (downward) the bottom plate 7*b* of the cooler 7. Specific shape parameters (see FIG. 5B) of this embodiment, including interval $y_2$, amplitude $z_1$, flow-channel interval $z_2$, and flow-channel width $z_3$, described later are common to those described in Embodiment 2.

Embodiment 2

Next referring to FIG. 4A to FIG. 6, the following describes the details of a cooler according to Embodiment 2 of the present invention.

In addition to the feature as stated above that the flow channels each have a corrugated shape such that the upper face and the lower face bend vertically in a synchronized manner, flow channels of the cooler each preferably have a corrugated shape so that their side faces bend horizontally (left-right direction) in a synchronized manner.

Figure 4A:
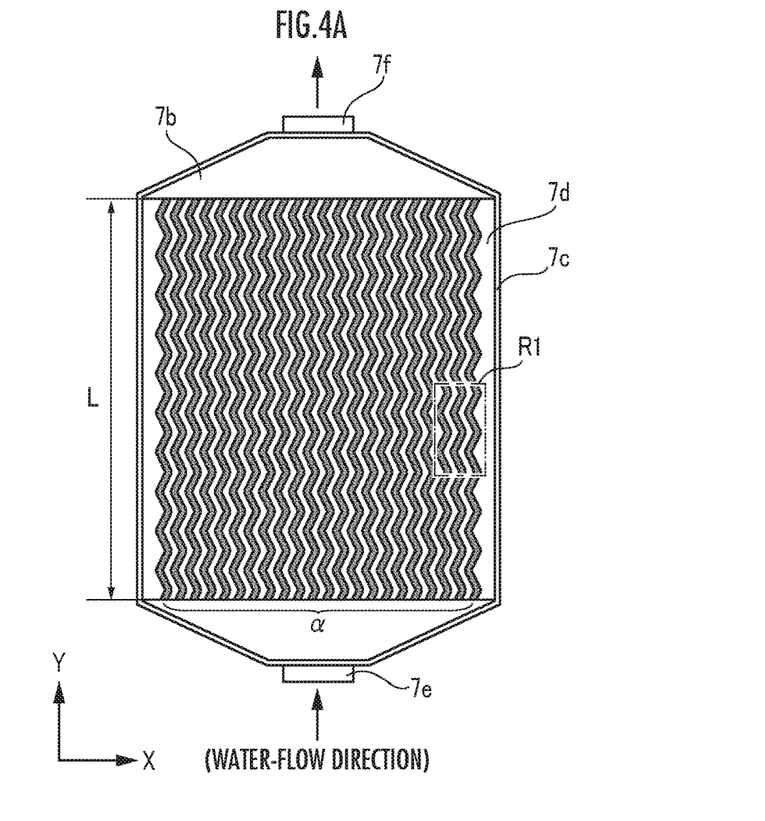
FIG. 4A shows the cooler of FIG. 1 viewed from the above of a top plate while omitting the top plate.

FIG. 4A shows the cooler 7 of FIG. 1 viewed from the above of the top plate 7*a* (perpendicularly to the top plate 7*a*) while omitting the top plate 7*a*. Actually the flow channels are invisible because of the uppermost plate-like fin 7*d*1, but they are shown for explanation's sake. The following refers to the flow channels on XY plane shown in the drawing as a flow channel α.

A large number of flow channels α are disposed in X-axis direction with regular intervals, and the flow channels α have a corrugated shape so that the both of the side faces of the flow channel α bend horizontally (X-axis direction) in a synchronized manner. The shape of the lateral frame 7*c* is not limited to an octagon, and the lateral frame 7*c* has the inlet 7*e* and the outlet 7*f* of fluid in Y-axis direction that is the traveling direction of the fluid (coolant, such as water).

Figure 4B:
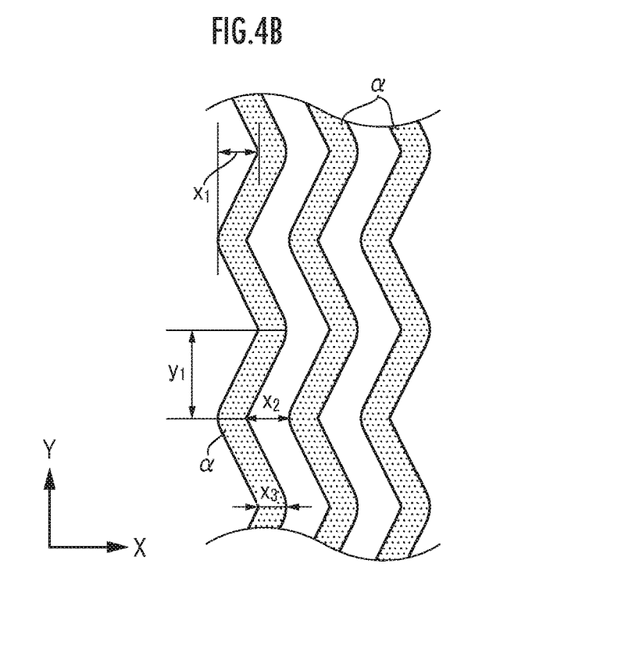
FIG. 4B is an enlarged view of region R1 in FIG. 4A.

FIG. 4B is an enlarged view of region R1 in FIG. 4A. Amplitude $x_1$ corresponds to the amplitude of the flow channel α, Preferably the amplitude $x_1$ is in the range of 0.2 to 1.5 mm. The flow-channel interval $x_2$ is the shortest interval between flow channels α, and preferably the flow-channel interval $x_2$ is in the range of 0.8 to 2.0 mm.

The flow-channel width $x_3$ is the width of the flow channel α, and flow-channel width $x_3$ in the present embodiment is 0.9 mm. Preferably the flow-channel width $x_3$ is in the range of 0.8 to 1.5 mm. A too narrow flow-channel width $x_3$ is not preferable because it causes clogging of the particles in the refrigerant or increases the pressure loss.

Preferably the flow-channel interval $x_2$ and the flow-channel width $x_3$ have the relationship of $2x_3 \leq x_2$. The flow-channel interval and the flow-channel width satisfying this condition increase the area of fluid coming in contact with the semiconductor elements 1*a* and 1*b*, and so improves cooling efficiency through heat exchange.

Preferably the flow channels have a corrugated shape that periodically bends horizontally, and one of the shape parameters indicating such periodicity is the interval $y_1$. The interval $y_1$ is the interval between the bents of the flow channels α, i.e., the distance between the adjacent crest and trough of the corrugated shape (half wavelength). Preferably the interval $y_1$ is in the range of 4.5 to 7.5 mm.

Figure 5A:
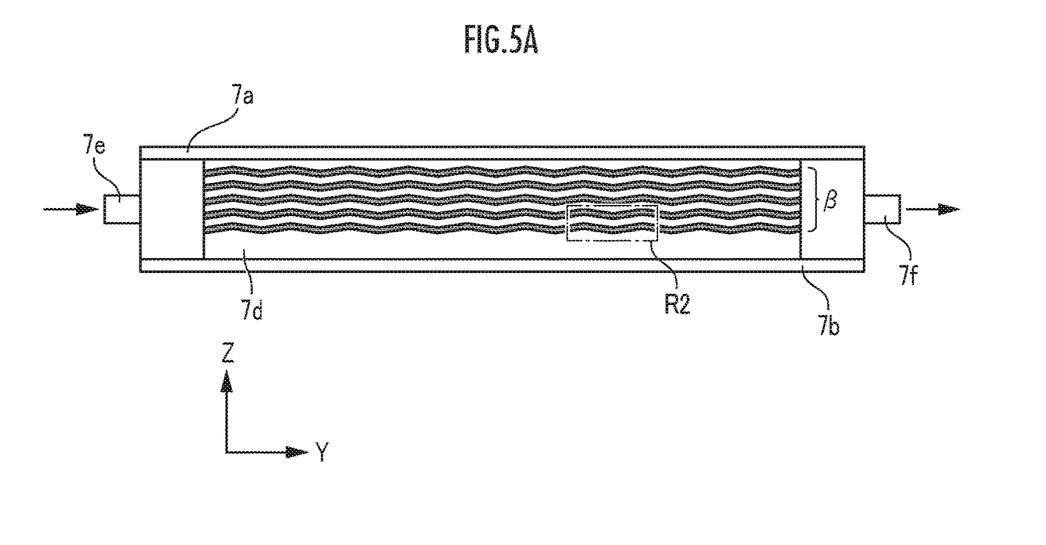
FIG. 5A is a side view of the cooler of FIG. 1 while omitting the lateral frame.

Next the following describes the corrugated shape of the flow channel that bends vertically. FIG. 5A is a side view of the cooler 7 of FIG. 1 while omitting the lateral frame 7*c*. In this case as well, actually the flow channels are invisible from the lateral of the flow-channel part 7*d*, but they are shown for explanation's sake. The following refers to the flow channels on YZ plane shown in the drawing as a flow channel β.

Fluid flowing into the cooler 7 through the inlet 7*e* travels through the flow channels of the flow-channel part 7*d*, and flows out through the outlet 7*f*. Five flow channels β are disposed in Z-axis direction with regular intervals, and the flow channels β have a corrugated shape so that both of the side faces of the flow channel β bend vertically (Z-axis direction) in a synchronized manner. The number of the flow channels changes with the number of the plate-like fins making up the flow-channel part 7*d*.

Figure 5B:
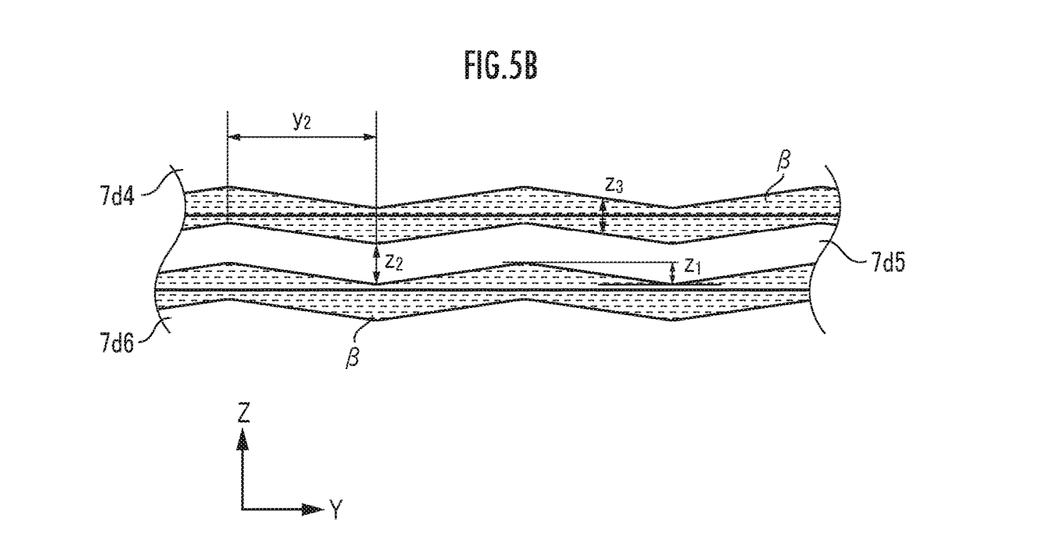
FIG. 5B is an enlarged view of region R2 in FIG. 5A.

FIG. 5B is an enlarged view of region R2 in FIG. 5A. Preferably the flow channels have a corrugated shape that periodically bends vertically, and one of the shape parameters indicating such periodicity is the interval $y_2$. The interval $y_2$ is the interval between the bents of the flow channels β, i.e., the distance between the adjacent crest and trough of the corrugated shape (half wavelength). The interval $y_2$ is in the range of 4.5 to 7.5 mm, which is preferably the same as the interval $y_1$ as stated above. The same intervals $y_1$ and $y_2$ facilitate the design of the flow channels because the characteristics of the flow channels, such as pressure loss, can be examined by changing the other parameters (especially, a phase difference described later).

Amplitude $z_1$ corresponds to the amplitude of the flow channel β. Preferably the amplitude $z_1$ is in the range of 0.2 to 1.5 mm, and the amplitude $z_1$ and the amplitude $x_1$ as stated above have the relationship of $z_1 \leq x_1 \leq 3z_1$. These amplitudes satisfying this condition increase the area of fluid coming in contact with the semiconductor elements 1a and 1b, and so improve cooling efficiency through heat exchange. In the present embodiment, the flow-channel width $z_3$ of the flow channels β is 0.9 mm, and the flow channels have a cross-sectional shape in Y-axis direction that is a square (see FIG. 1). Preferably the flow-channel width $z_3$ is in the range of 0.8 to 1.5 mm.

The flow-channel interval $z_2$ is the interval between the adjacent flow channels β, which is the thickness of the plate dividing these flow channels. Preferably the flow-channel interval $z_2$ is in the range of 0.3 to 2.0 mm. A flow-channel interval $z_2$ of 0.3 mm or more does not cause deformation of the fins, and so satisfies the strength as the cooler. The flow-channel interval $z_2$ exceeding 2.0 mm degrades the cooling efficiency, and so the flow-channel interval $z_2$ preferably is 2.0 mm or less.

Figure 6:
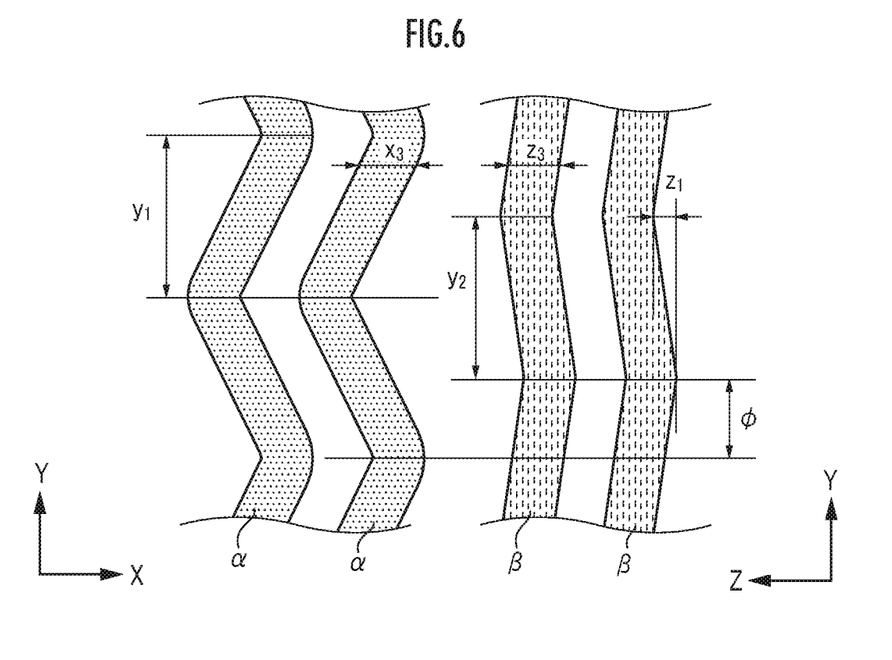
FIG. 6 explains a phase difference between flow channels of the cooler in a plan view from the above of the top plate and the flow channels in a side view.

Next referring to FIG. 6, the following describes a phase difference between the flow channels α on YY plane and the flow channels on YZ plane. For explanation's sake, both of these flow channels are shown on the same plane of the drawing.

These flow channels α and flow channels have displacement at peaks of the corrugated shape that is the angle φ, and this displacement is the phase difference between their waveforms. Although described later in details, this phase difference φ is an important shape parameter of the cooler 7 that affects the cooling efficiency (temperatures of the semiconductor elements 1a and 1b) and the pressure loss.

As shown in the drawing, in the present embodiment, the interval $y_1$ of the flow channels α and the interval $y_2$ of the flow channels β are preferably equal in terms of the cooling efficiency. The flow-channel width $x_3$ of the flow channels α and the flow-channel width $z_3$ of the flow channels β also may be equal (but they are different in amplitude).

Figure 7A:
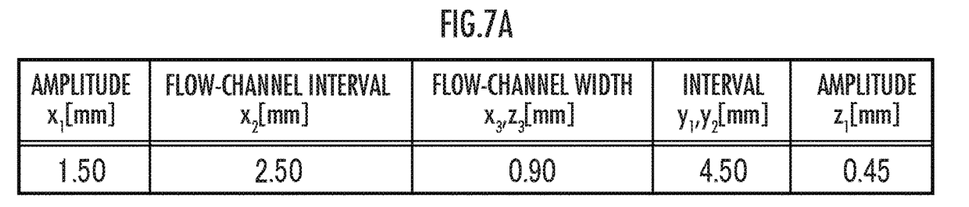
FIG. 7A shows the list of parameters for measurement of the temperature and the pressure loss.
Figure 7B:
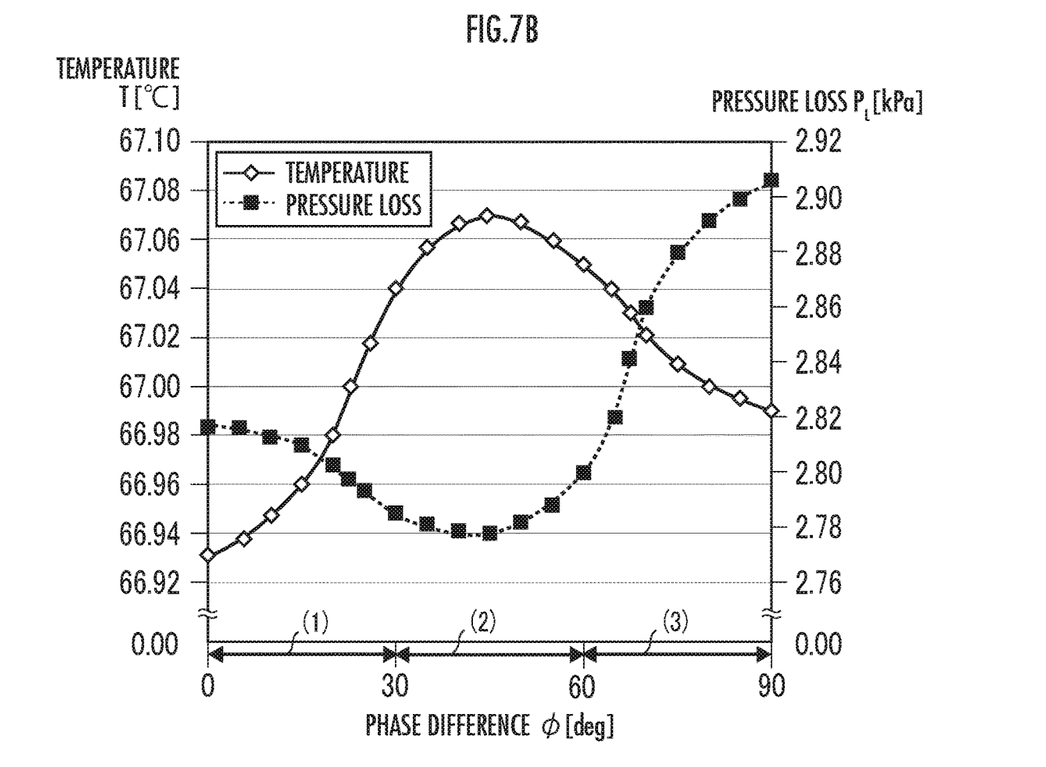
FIG. 7B shows the measurement result of the temperature and the pressure loss while changing the phase difference.

Next referring to FIG. 7A and FIG. 7B, the following explains the simulation result for measurement of the temperature and the pressure loss while changing the shape parameters of the flow-channel part 7d of the present invention with thereto-fluid analysis software. Note here that the result from prototypes actually produced showed the same result as the simulation result.

Examples of the shape parameters affecting the temperature T(° C.) and the pressure loss $P_L$, (kPa) of the flow-channel part 7d include the amplitude $x_1$, the flow-channel interval $x_2$, the flow-channel width $x_3$, the interval $y_1$, the interval $y_7$, the amplitude $z_1$, the flow-channel interval $z_3$, and the phase difference φ as stated above.

The overall dimensions of the cooler 7 were 10.0 mm in length in Z-axis direction, 53.0 mm in length in X-axis direction, and 50.0 mm in length in Y-axis direction. The amplitude $x_1$, the flow-channel interval $x_2$, the flow-channel widths $x_3$ and $z_3$, the intervals $y_1$ and $y_2$, and the amplitude $z_1$ of the plate-like fins 7d1 to 7d6 were set at the values shown in FIG. 7A, and the temperature T and the pressure loss $P_L$ were measured while changing the phase difference φ only. The following describes the result.

The temperature T was measured at a part close to the center of the cooler 7 with a thermal insulation system (not shown) having a heater. Specifically the output of the heater was 1110 W, the coolant was pure water, and the inflow rate through the inlet 7e was set at 4.0 (L/min.). The pressure loss $P_L$ was evaluated under the same inflow rate and as a difference in pressure between the inlet 7e and the outlet 7f of the cooler 7.

FIG. 7B shows the measurement result of the temperature T and the pressure loss $P_L$ while changing the phase difference φ. When the phase difference φ is 0 degree, i.e., the flow channels α and the flow channels β are in phase, the temperature T was the lowest at 66.93° C. and the pressure loss $P_L$ was 2.81 (kPa). Lower temperature T means higher radiation performance and so higher cooling efficiency. Smaller pressure loss $P_L$ means a smaller output of the pump required to send out the fluid, and the fluid progresses without loss in the flow channels.

As the phase difference φ increased, the temperature T gradually rose. When the phase difference φ was about 45-degree, the temperature T was the highest (67.07° C.). At this time, the pressure loss $P_L$ gradually fell, and when the phase difference φ was about 45-degree, the pressure loss $P_L$ was the lowest (2.78 kPa).

After that, as the phase difference φ increased, the temperature T gradually fell. When the phase difference φ was 90-degree, the temperature T was 66.99° C. At this time, the pressure loss $P_L$ gradually rose, and when the phase difference φ was 90-degree, the pressure loss $P_L$ was the highest at 2.91 (kPa).

As the phase difference φ increases from 45-degree, a part having the bents of the flow channels α and the bents of the flow channels β continuously occurs, and the flow rate of the fluid increases. As a result, the cooled fluid comes in contact with the semiconductor elements 1a and 1b, and so this decreases the temperature T presumably. At this time, the fluid receives friction from the continuous bents and so the pressure loss $P_L$ of the fluid may increase.

The measurement result of the temperature T and the pressure loss $P_L$ shows that region (1) in the drawing having the phase difference φ of 0 to 30 degrees yielded low temperature T as well as low pressure loss $P_L$ and this region was the optimum condition. The measurement result also shows that region (2) in the drawing having the phase difference φ of 30 to 60 degrees yielded a good result of low pressure loss $P_L$, but had high temperature T that means a low cooling effect. This condition therefore is difficult to adopt.

The measurement result also shows that region (3) in the drawing having the phase difference φ of 60 to 90 degrees yielded high pressure loss $P_L$ but had lower temperature T than region (2), and this condition therefore is usable.

When the phase difference φ is 90 degrees or more, the result of FIG. 7B will show periodically. In one example, when the phase difference φ is 120 degrees, the result will be the same as that from 30 degrees in FIG. 7B. That is, region (1) in the drawing can be generalized as in $0°+90°n \leq \phi \leq 30°+90°n$ (n=0,1,2,3). The range of the phase difference φ in region (1) enables the cooler to exert the function the most.

Similarly region (2) in the drawing can be generalized as in $30°+90°n < \phi < 60°+90°n$ (n=0,1,2,3). In one example, the phase difference φ of 130 degrees the range of n=1) corresponds to this case. Region (3) in the drawing can be generalized as in $60°+90°n \leq \phi \leq 90°+90°n$ (n=0,1,2,3). In one example, 370 degrees (in the range of n=3) corresponds to this case.

Figure 8:
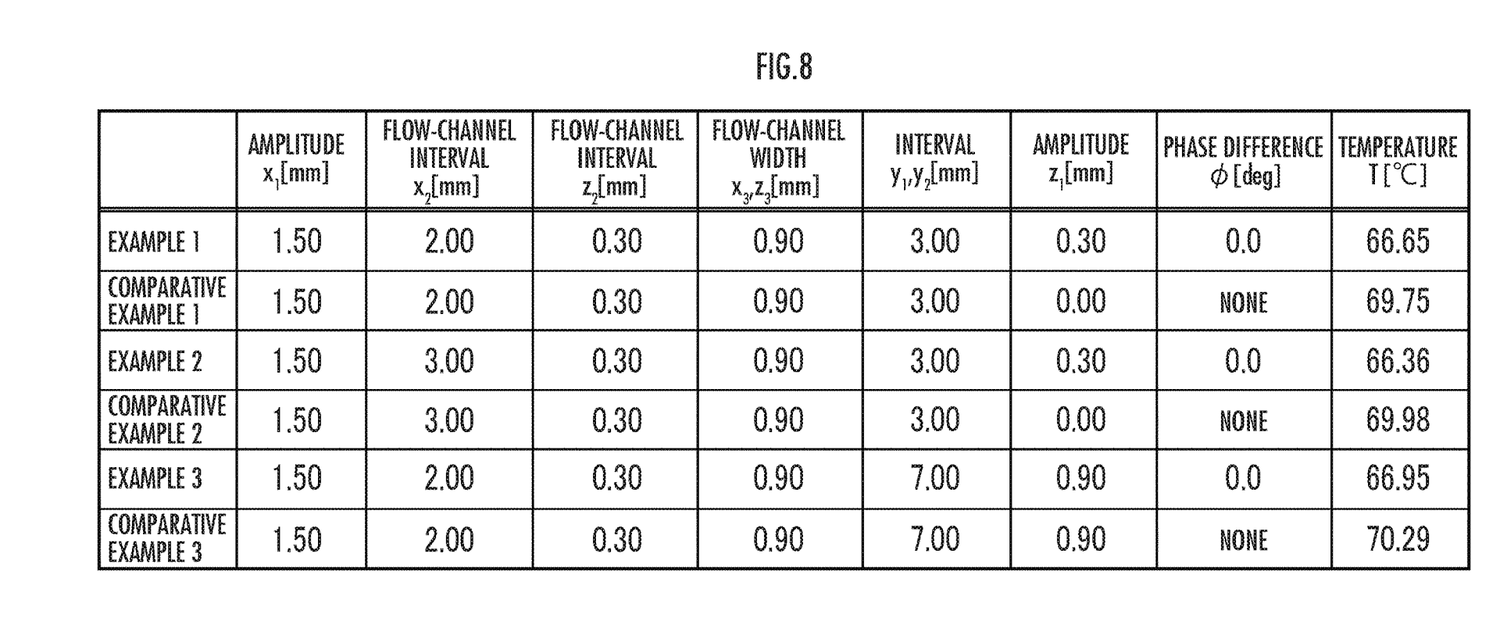
FIG. 8 shows comparative results of the temperature between flow channels of Embodiment 2 of the present invention and flow channels having a corrugated shape that bends periodically only horizontally.

Lastly FIG. 8 shows a comparison result of the temperature T of the flow channels having the shape parameters shown in this table between Embodiment 2 (Example) and a Comparative Example. As stated above, the flow channels of Embodiment 2 have a corrugated shape that bends periodically in the vertical direction and in the horizontal direction. The flow channels of Comparative Example had a corrugated shape that bends periodically only in the horizontal direction.

Specifically these flow channels had the same values for the amplitude $x^1$, the flow-channel intervals $x_2$, $z_2$, the flow-channel widths $x_3$, $z_3$, and the intervals $y_1$ and $y_2$. Then comparison was made about temperature T of fluid between the structure with the amplitude in the vertical direction (Example) and the structure without amplitude in the vertical direction (Comparative Example). In one example, when Example 1 only had the amplitude $z_1$ of 0.30 mm, a comparison result between Example 1 and Comparative Example 1 showed that the temperature T of Example 1 was 66.65° C. and the temperature T of Comparative Example 1 was 69.75° C.

The comparison results between Example 2 and Comparative, Example 2 and between Example 3 and Comparative Example 3 also showed that the temperature T of the flow channels in Examples having the amplitude in the vertical direction was low, meaning excellent cooling efficiency. This is because the flow channels of Examples led to easy transmission of the heat from the semiconductor elements toward the lower face of the cooler.

That is the description on the cooler 7 including the plurality of plate-like fins 7d1 to 7d6, and the present invention is not limited to these embodiments. In one example, the material of the plate-like fins is not limited to Al or Cu, which may be another material having high thermal conductivity. Fluid (coolant) flowing through the flow channels may be other types of refrigerant instead of water, which is typically used.

With this configuration, fluid passing through the flow channels of the flow-channel part 7d travels while swaying vertically (Z-axis direction) as well as horizontally (X-axis direction). Such a structure of the flow channels enables the cooled fluid flowing into the flow-channel part 7d through the inlet 7e to travel through the flow channels while generating the exchange of the fluid in Z-axis direction and without generating swirling flow or stopping. This effectively brings the cooled fluid into contact with the inner walls of the flow channels of the cooler 7, and so improves the cooling effect through heat exchange.

DESCRIPTION OF REFERENCE NUMERALS 1a, 1b Semiconductor element
2a to 2c Metal bonding member
3 Wiring board
4 Pin
5 Multilayer board
7 Cooler
7a Top plate
7b Bottom plate
7c Lateral frame
7d, 7d' Flow-channel part
7d1 to 7d6 Plate-like fin
7e Inlet
7f Outlet
8 Resin
9 Case
51 First conducting plate
52 Insulating substrate
53 Second conducting plate
100 Semiconductor module

The invention claimed is:

1. A cooler comprising: a flow-channel part at least including a top plate and a bottom plate; and a plurality of continuous groove-like flow channels defined between the top plate and the bottom plate to flow fluid, the cooler being configured to cool a semiconductor element, wherein
the plurality of flow channels is formed evenly spaced in parallel when viewed from a direction perpendicular to the top plate,
the plurality of flow channels are all equal in distance from the top plate when viewed from a direction parallel to the top plate and intersecting the flow channels, the flow channels each has a corrugated shape so that faces of the flow channels closer to the top plate and faces of the flow channels closer to the bottom plate bend in a synchronized manner toward the top plate and the bottom plate.

2. A cooler comprising: a flow-channel part at least including a top plate and a bottom plate; and a plurality of continuous groove-like flow channels defined between the top plate and the bottom plate to flow fluid, the cooler being configured to cool a semiconductor element,
wherein when viewed from a direction parallel to the top plate and intersecting the flow channels, each of the flow channel has a corrugated shape so that a face of the flow channel closer to the top plate and a face of the flow channel closer to the bottom plate bend in a synchronized manner toward the top plate and the bottom plate,
the flow-channel part includes at least one plate-like fin disposed between the top plate and the bottom plate, the plurality of flow channels is formed in parallel in a vertical direction and is partitioned by the plate-like fin and is defined between the top plate and the bottom plate, and
when the flow-channels are viewed from the direction parallel to the top plate and intersecting the flow channels, the plurality of flow channels each has a corrugated shape so that faces of the flow channels closer to the top plate and faces of the flow channels closer to the bottom plate bend in a synchronized manner with an upper face and a lower face of the plate-like fin.

3. A cooler comprising:
a flow-channel part at least including a top plate and a bottom plate; and a plurality of continuous groove-like flow channels defined between the top plate and the bottom plate to flow fluid, the cooler being configured to cool a semiconductor element,
wherein when the flow-channels are viewed from a direction parallel to the top plate and intersecting the flow channels, each of the flow channels has a corrugated shape so that a face of the flow channel closer to the top plate and a face of the flow channel closer to the bottom plate bend in a synchronized manner toward the top plate and the bottom plate, and
when the flow-channels are viewed from a direction perpendicular to the top plate, each of the flow channels has a corrugated shape so that two side faces of the flow channel bend in a synchronized manner.

4. The cooler according to claim 3, wherein the corrugated shape of the flow channel viewed from the direction perpendicular to the top plate and the corrugated shape of the flow channel viewed from the direction parallel to the top plate and intersecting the flow channel have a phase difference $\phi$ satisfying a relationship of $0°+90° n \leq \phi \leq 30°+90° n$ or $60°+90° n \leq \phi \leq 90°+90° n$ (n=0,1,2,3).

5. The cooler according to claim 3, wherein when $x_1$ denotes amplitude of the flow channel viewed from the direction perpendicular to the top plate and $z_1$ denotes amplitude of the flow channel viewed from the direction parallel to the top plate and intersecting the flow channel, $x_1$ and $z_1$ have a relationship of $z_1 \leq x_1 \leq 3z_1$.

6. The cooler according to claim 3, wherein when $x_2$ denotes an interval between the adjacent flow channels and $x_3$ denotes a width of each flow channel viewed from the direction perpendicular to the top plate, $x_2$ and $x_3$ have a relationship of $2x_3 \leq x_2$.

7. A semiconductor module comprising:
a semiconductor element;
a multilayer board having the semiconductor element mounted thereon, the multilayer board including an insulating substrate and conducting plates sandwiching the insulating substrate from an upper face and a lower face of the insulating substrate; and
a cooler bonding with a face of the multilayer board where the semiconductor element is not mounted, the cooler being configured to flow fluid to cool the semiconductor element, the cooler being the cooler according to claim 1.

8. The cooler according to claim 2, wherein the plurality of the flow channels is formed evenly spaced in parallel when viewed from a direction perpendicular to the top plate, and the flow channels are all equal in distance from the top plate when viewed from the direction parallel to the top plate and intersecting the flow channels.

9. The cooler according to claim 3, wherein an interval $y_1$ between a crest and a trough of the flow channel viewed from the direction perpendicular to the top plate is equal to an interval $y_2$ between a crest and a trough of the flow channel viewed from the direction parallel to the top plate and intersecting the flow channel.

10. The cooler according to claim 3, wherein the flow-channel part further includes at least one fin having grooves each forming the flow channel and arranged side by side in the at least one fin, each groove having a plurality of deep parts and shallow parts arranged alternately in a thickness direction of the at least one fin.

11. The cooler according to claim 10, wherein the flow-channel part further includes another fin having grooves each forming the flow channel and arranged side by side in the another fin, each groove of the another fin having a plurality of deep parts and shallow parts arranged alternately in the thickness direction of the another fin, the deep parts and the shallow parts of the another fin being arranged to face the shallow parts and the deep parts of the at least one fin.

* * * * *